United States Patent

Sawada et al.

Patent Number: 5,804,046
Date of Patent: Sep. 8, 1998

[54] THIN-FILM FORMING APPARATUS

[75] Inventors: Susumu Sawada, Tokyo; Junichi Anan, Kitaibaraki; Yoshitaka Kakutani, Kitaibaraki; Hironori Wada, Kitaibaraki; Fumihiko Yanagawa; Roderick Craig Mosely, both of Tokyo, all of Japan

[73] Assignee: Japan Energy Corporation, Tokyo, Japan

[21] Appl. No.: 269,971

[22] Filed: Jul. 1, 1994

[30] Foreign Application Priority Data

Jul. 6, 1993 [JP] Japan .................................. 5-191612

[51] Int. Cl.⁶ .................................................. C23C 14/04
[52] U.S. Cl. ...................... 204/298.11; 118/301; 118/504
[58] Field of Search ..................... 118/301, 504; 204/192.11, 298.11, 298.04

[56] References Cited

U.S. PATENT DOCUMENTS

| | | | |
|---|---|---|---|
| 4,988,424 | 1/1991 | Woodward et al. | 204/298.11 X |
| 5,099,134 | 3/1992 | Hase et al. | 250/505.1 |
| 5,135,629 | 8/1992 | Sawada et al. | 204/192 |
| 5,223,108 | 6/1993 | Hurwitt | 204/192.12 |

FOREIGN PATENT DOCUMENTS

| | | |
|---|---|---|
| A 0313750 | 5/1989 | European Pat. Off. . |
| A 0512296 | 11/1992 | European Pat. Off. . |
| 0310965 | 12/1988 | Japan .................................. 204/298.11 |
| A 3123021 | 5/1991 | Japan . |

*Primary Examiner*—Robert J. Warden
*Assistant Examiner*—E. Leigh Dawson
*Attorney, Agent, or Firm*—Panitch Schwarze Jacobs & Nadel, P.C.

[57] ABSTRACT

A collimator having a particle getter function, and a thin-film forming apparatus equipped with the collimator disposed between a target and a wafer. The collimator is fabricated by assembling particle getter sheets into a lattice, honeycomb, or other structure having a number of rows of openings and fixing the assembly into a frame. The particle getter sheets refers collectively to sheets and plates to be assembled integrally to provide a surface having excellent particle capturing and holding actions. Typically, the collimator is a lattice assembly of embossed, slitted particle getter sheets. The film deposited on the collimator is kept from peeling off, without deteriorating the collimator performance.

4 Claims, 4 Drawing Sheets

THIN-FILM FORMING APPARATUS

FIELD OF THE INVENTION

This invention relates to a thin-film forming apparatus, and more specifically to a thin-film forming apparatus provided with a collimator having a particle getter function and designed to be held between a film forming source and a substrate. This invention also relates to a collimator for a thin-film forming apparatus composed of particle getter sheets.

BACKGROUND OF THE INVENTION

Vapor phase film growth technology has been widely used in forming many different thin films, e.g., thin films for the electrodes and diffusion barriers of integrated circuits, magnetic films for magnetic recording media, and clear conductive films of indium-tin oxide (ITO) for liquid crystal display units. Thin film formation techniques based upon this vapor phase film growth principle include chemical vapor phase growth methods such as thermal decomposition, hydrogen reduction, disproportionation reaction and plasma chemical vapor deposition (CVD); physical vapor phase methods such as vacuum vapor deposition, sputtering and ion beam techniques; and further discharge polymerization method.

In sputtering process, for example, a target and a substrate such as a wafer are located opposite to each other, and atoms released from the target by sputtering deposit on the substrate to form a thin film over it. With the recent increases in degrees of integration of electronic devices, diverse techniques for thin film formation have been required. To cite one example, wafers having deep pits sometimes need to be coated with a uniform film, even on the bottom surface of each pit. In ordinary sputtering, as shown at FIG. 1A, a majority of sputtered atoms are scattered aslant with respect to the wafer surface. They are unable to travel deep into the pit but deposit mostly around the inlet opening of the pit, and so it is impossible to form a uniform film extending to the bottom of a deep pit.

Under such circumstances, a technique called collimation sputtering was proposed (see, e.g., Patent Application Public Disclosure No. 123021/1991). It uses a collimator disposed between a substrate on which a film is to be formed and a film forming source held opposite to the substrate in a vacuum film forming apparatus wherein the collimator allows to pass sputtered atoms therethrough only in the direction perpendicular to the surface of the substrate so that a strongly directional film forming can be performed. In collimation sputtering, as at FIG. 1B, the collimator captures obliquely scattering atoms and passes only the atoms sputtered perpendicularly to the wafer surface. Consequently, a film can be formed uniformly extending even to the bottom surfaces of deep pits. The collimator in use is, e.g., a stainless steel ring of a honeycomb structure having arrays of openings 20 mm in diameter. The abovementioned Patent Application Public Disclosure No. 123021/1991 discloses a collimator which comprises a plurality of tube assemblies and a collimator composed of two sets of parallel sheets arranged in series and at right angles to each other which cooperate to form the openings for straight travel of atoms.

Thin-film forming processes that involve vapor phase growth have already been established as mass production techniques, but they pose a problem of deposition of coarsened or clustered particulate matter, commonly called particles, on the resulting film.

The particles refer to ones that scatter and deposit in clusters on a substrate inside the apparatus during thin film formation. The clustered particles are often as large as several microns in diameter. Their deposition on a substrate can cause problems, e.g., of shorting or breaking of conductor lines in large-scale integrated circuits, leading to an increased percentage of rejects. These particles result from various factors, including the thin film process itself and the film forming apparatus used.

A major source of the particles resulting from the film forming apparatus is scattered particulate matter deposited around the substrate, on inner walls of the apparatus, and on components such as shutters and shields to form deposit films which peel off, scatter again, and deposit on the substrate as a contaminant. In order to prevent the particle generation caused by peeling of the deposited film, it is necessary that the surfaces of the inner walls and components of the film forming apparatus be kept clean. However, maintaining the cleanliness of the inner walls actually involves great difficulties. Complete cleaning takes enormous time and some inner wall portions and component parts are practically inaccessible for cleaning.

One possible countermeasure considered was the use of disposable foil, such as Al or electrolytic Fe foil. If such a foil is affixed to inner walls beforehand and removed after film forming (coating operation), the inner walls could be kept clean. However, a fatal defect was found in the disposable foils. The film forming scattered matter deposited on such a foil peels off easily and still presents the problem of particle generation on the deposited film on the substrate. In order to avoid the occurrence of such peeling, frequent replacement of the foil will be necessary, which would seriously affect the productivity of film forming operation.

In view of the above, it was previously proposed to use, in place of the conventional Al, electrolytic Fe, or other metallic foil, (1) a treated electrolytic copper foil (electrolytic copper foil whose matt side is further electrolytically treated so that fine particles of copper or copper oxide are deposited at random on minute rounded protuberances (knobs) originally existing on the matt side); (2) the treated electrolytic copper foil further coated with either the same material as the thin film to be formed by a thin-film forming apparatus or a similar harmless material; (3) a metallic foil in a bellow form; (4) a metallic foil formed with numerous protrusions and dents formed by embossing; or (5) a thermally sprayed metallic film meshed on one side for added strength and improved effect on peeling prevention. These improved metallic foils and sprayed film are by far superior to ordinary metallic foils in their action of capturing and holding scattered particulate matter. They effectively prevent the generation of particles, and therefore are generically called "particle getter (PG)". It has been confirmed that affixing these particle getter foils to the inner walls and to parts such as shutters and shields inside the film forming apparatus reduces particle generation remarkably and improves the yield and reliability of the resulting thin film. As to these particle getters, refer, e.g., to U.S. Pat. No. 5,135,629.

With a thin-film forming apparatus using a collimator, an increase in particle generation is observed even when a particle getter foil is affixed to the surrounding walls and components such as shutters inside the apparatus. The increased particle generation spoils the excellent film forming characteristics of the collimator. Although it might appear possible to attach the particle getter foil to the collimator too, it would impair the fundamental function of the collimator that has a multiplicity of small openings.

OBJECT OF THE INVENTION

The present invention is aimed at reducing the amount of particle generation in a thin-film forming apparatus using a collimator, without impairing the function of the collimator.

SUMMARY OF THE INVENTION

The increased particle generation in a thin-film forming apparatus equipped with a collimator is ascribable to the peeling of the particulate matter film deposited and formed on the collimator. Affixing a particle getter foil to the collimator mars the geometric characteristics of its many small openings formed in a number of rows and impairs the function of the collimator as such. With these in view, the present inventors conceived of allowing a collimator that is ordinarily made of stainless steel sheets to serve as a particle getter too and obtained good results as the result of trials. Thus, this invention provides a collimator for a thin-film forming apparatus composed of particle getter sheets and also a thin-film forming apparatus characterized in that a collimator which is composed of particle getter sheets is set between a film forming source and a substrate. A preferred example of the collimator consists of embossed, slitted particle getter sheets assembled in a lattice pattern.

The collimator itself is allowed to serve as a particle getter too so that the particulate matter film deposited and formed on it is kept from peeling off as a particle source, without impairing the function of the collimator as such.

BRIEF EXPLANATION OF THE DRAWINGS

FIGS. 4A–4C shows the sequence of steps for assembling the particle getter collimator of FIG. 3A wherein FIG. 4A shows a PG sheet formed with central slots and a PG sheet slitted along the both edges, FIG. 4B shows the above two types of the PG sheets being folded from the center; and FIG. 4C shows the PG sheets after subjecting to embossing working on an embossing machine.

DETAILED EXPLANATION OF EMBODIMENTS

Figure 1A:
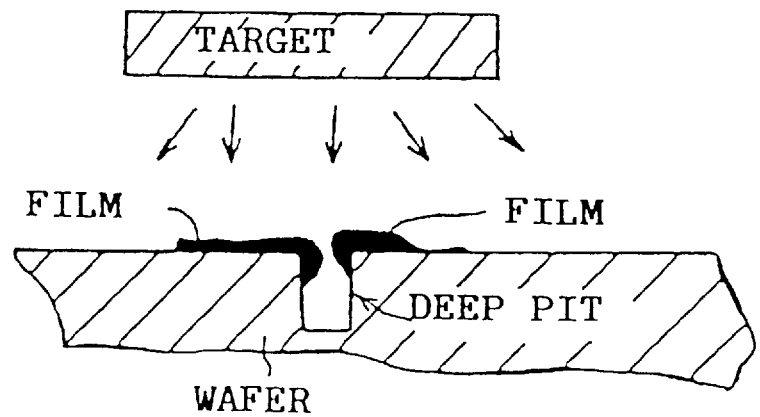
FIG. 1A illustrates a wafer fragment having a deep pit being sputtered in a usual manner, which is unable to form a uniform film in a bottom of the pit.
Figure 1B:
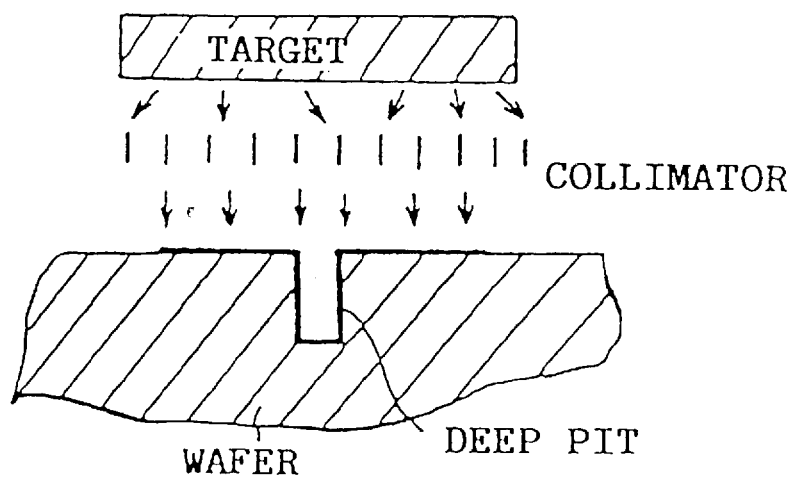
FIG. 1B illustrates collimation sputtering of a wafer fragment having a deep pit, wherein a uniform film is formed at a bottom of the pit.

For the purposes of the present invention, the term "thin-film forming apparatus" is used generically to mean a thin-film forming apparatus that operates using the vapor phase growth techniques, including thermal decomposition, hydrogen reduction, disproportionation reaction, transport reaction, plasma CVD, depressurization CVD and other chemical vapor growth techniques; vapor phase epitaxy (VPE), vacuum vapor deposition, sputtering, molecular beam epitaxy (MBE), ion beam, and other physical vapor growth techniques; and discharge polymerization method.

The term "particle getter (PG) sheets" as used herein encompasses all the sheets and plates treated to perform a particle getter function, or adapted to form an integral surface excellently capable of capturing and holding particles, and which have sufficient structural strength to fabricate a collimator. Typical examples of the sheets to be used are:

(1) treated electrolytic copper sheet;
(2) treated electrolytic copper sheet further coated with either the same material as the thin film to be formed by a thin-film forming apparatus or a similar harmless material;
(3) metallic sheet in bellow form;
(4) embossed metallic sheet;
(5) combination of 1 or 2 with 3 or with 4;
(6) thermally sprayed metallic sheet;
(7) electrolytic nickel sheet; and
(8) electrolytic stainless steel (SUS) sheet.

The treated electrolytic copper sheet refers to the electrolytic copper sheet whose matt side is further electrolytically treated so that fine particles of copper or copper oxide are deposited additionally at random on minute rounded protuberances (knobs) originally existing on the matt side. The deposition of fine particles (nodules) of copper or copper oxide on the knobbed rough surface is observed under an electron microscope. Exemplary conditions for the electrolytic treatment are as follows:

(A) Water-soluble copper sulfate plating bath $CUSO_4.5H_2O$, g/l (as Cu): 23

NaCl, ppm (as Cl): 32

$H_2SO_4$, g/l: 70

Glue, g/l: 0.75

Pure water:balance (B) Plating conditions

Current density: 60–100 A/ft$^2$

Bath temperature: 70°–80° F.

Time: 10–100 sec.

The treated electrolytic copper sheet desirably has a surface roughness Rz ranging from 5.0 to 10.0 μm. The presence of protrusions that constitute this roughness broadens the surface area and produces an anchoring effect. Consequently, the deposited film of the scattered particulate matter becomes more adhesive to the surface, and peeling phenomenon hard to occur.

The treated electrolytic copper sheet may be further coated with either the same material as the thin film to be formed by a thin-film forming apparatus or a similar harmless material to prepare a coated, treated electrolytic copper sheet. The coating comprises an anticontamination film of a metal, alloy, silicide, oxide, or the like as thin as 1000 to 100000 Å formed by vapor phase growth or other technique and provides more complete protection against the contaminant that originates from copper sheets in the apparatus.

By the metallic sheet in a bellow form is meant a copper, nickel, stainless steel, or other metallic sheet worked, e.g., by roll forming, into a bellow form. The working into a bellow form markedly increases the surface area and decreases the rate of deposition per unit area, thereby controlling increases in internal stresses in the deposited film and reducing the possibility of film peeling caused by cracking of the deposited film.

The embossed metallic sheet is obtained by pressing, roll forming, or otherwise working a metallic sheet to form random or regular projections and dents on the surface. Embossing again sharply increases the surface area and decreases the rate of deposition per unit area. It thus restricts increases in internal stresses in the deposited film and lessens peeling caused by cracking of the deposited film.

The thermally sprayed metallic sheet take s the advantage of the suitable surface irregularities formed by the sprayed film that produce an anchoring effect, and improves the adhesion to the deposited film of the scattered particulate matter and lessens its peeling.

The treated electrolytic copper sheet may, of course, be worked to form bellows or be embossed to further enhance its particle getter function. Electrolytic nickel and electrolytic stainless steel (SUS) sheets are useful too.

Figure 2:
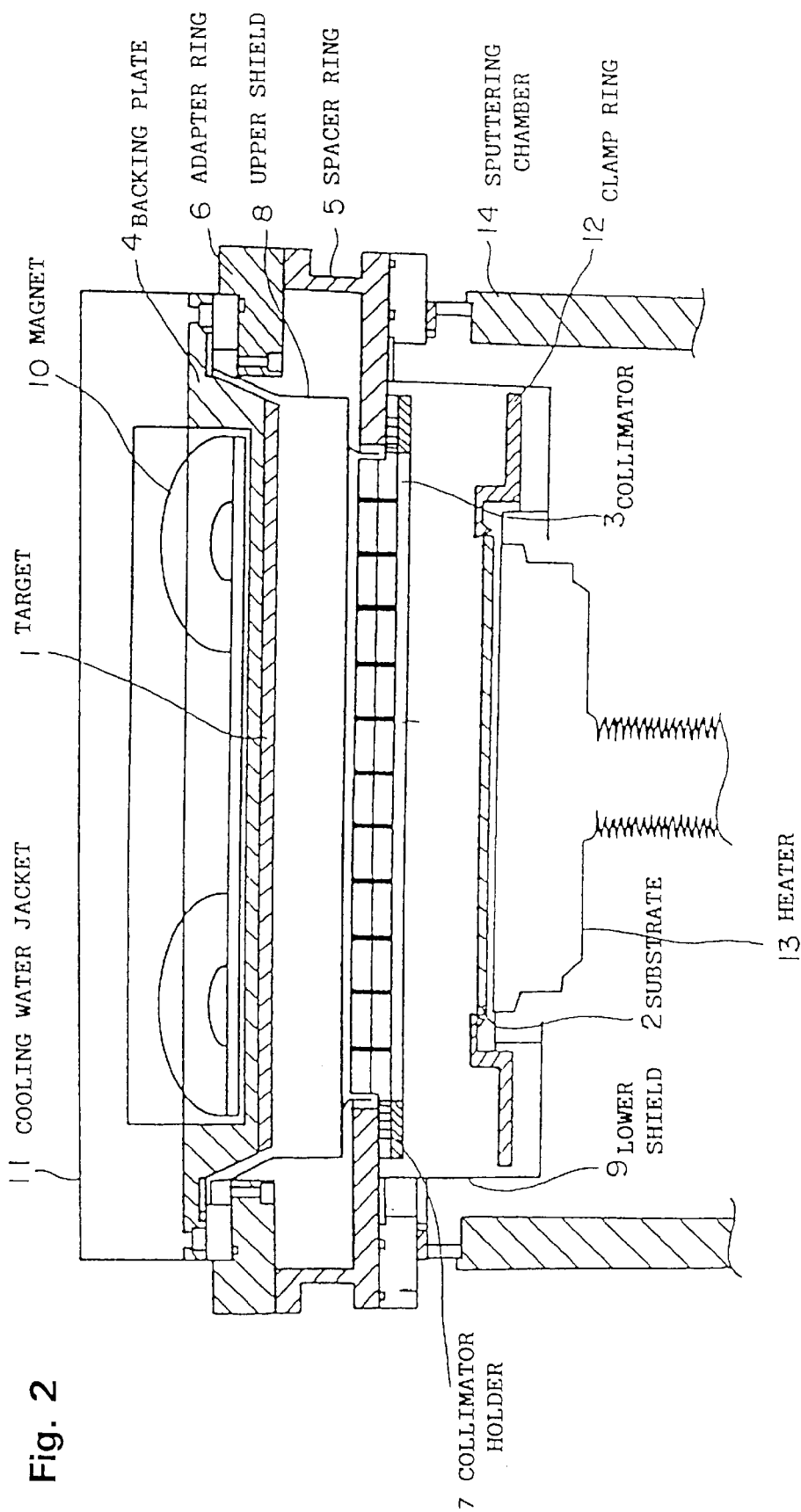
FIG. 2 is a schematic sectional view of the essential parts of an apparatus for forming thin films by target sputtering as an embodiment of this invention.

As one embodiment of the present invention, FIG. 2 shows essential parts of an apparatus that forms thin films by target sputtering. Inside the apparatus, a target 1 and a substrate 2 such as a silicon wafer are held in parallel and opposed to each other, with a collimator 3 having a particle getter function set therebetween. The target 1 is bonded or attached to a backing plate 4, which in turn is fixed to an adapter ring 6 mounted on a spacer ring 5. Magnets 10 are disposed on the back side of the target 1 opposite to the side facing the substrate 2. They are cooled with cooling water inside a cooling water jacket 11. The collimator 3 is secured to a collimator holder 7 by screws or other fastener means. It has a number of openings, or collimator cells, through which atoms are allowed to pass vertically downward toward and against the substrate surface. The substrate 2 is supported by a suitable clamp ring 12. The substrate 2 is heated to a proper temperature by a heater 13 in a sputtering chamber 14. An upper shield 8 is interposed between the target and collimator, and a lower shield 9 is interposed between the collimator and wafer. Of the atoms released by sputtering from the target 1, only those sputtered perpendicularly to the surface of the substrate 2 are allowed to pass the collimator 3, while the atoms scattering aslant are captured by the collimator 3 and, owing to its strong holding action, they are kept from peeling off during the sputtering operation.

Figure 3A:
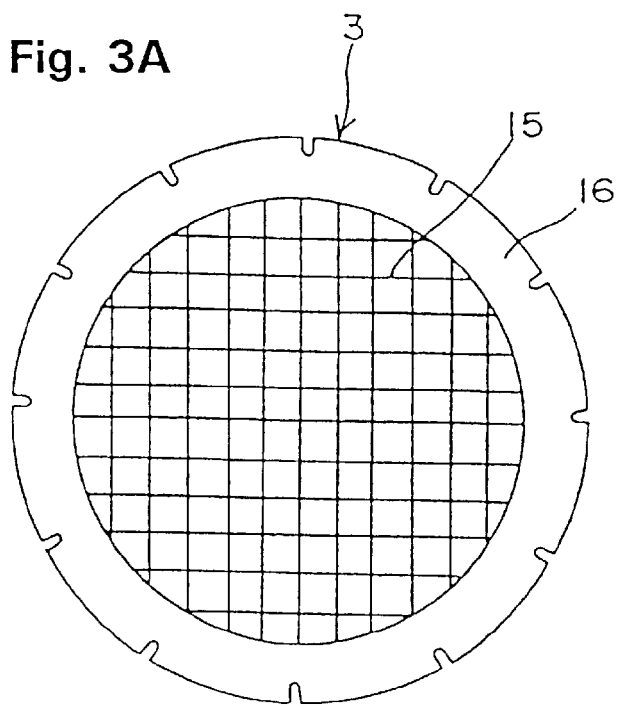
FIG. 3A is a top view of a lattice collimator having a particle getter function.
Figure 3B:
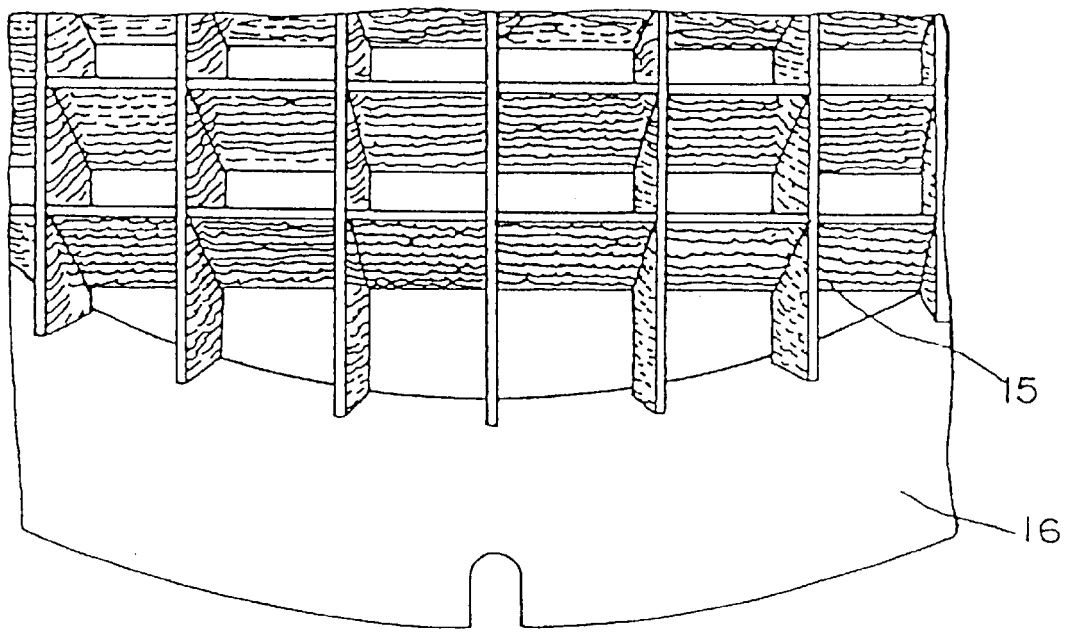
FIG. 3B is a fragmentary perspective view of the collimator of FIG. 3A.
Figure 4A:
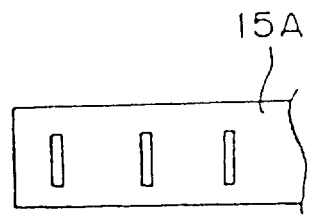
Figure 4A:
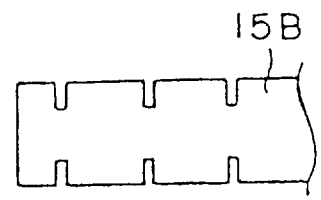
Figure 4B:
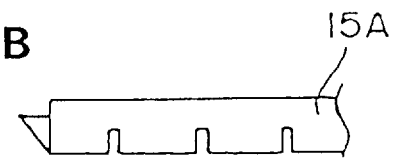
Figure 4B:
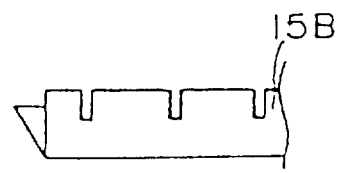
Figure 4C:
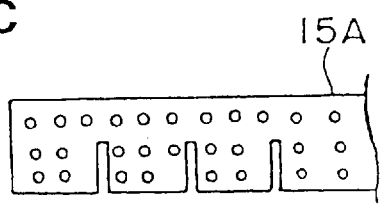
Figure 4C:
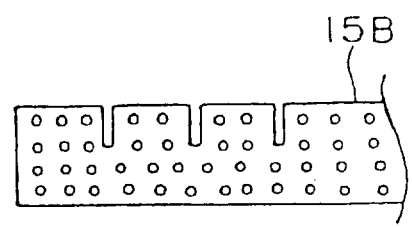

In FIG. 3A is a top view of a collimator 3 having a particle getter function, and FIG. 3B is a fragmentary perspective view of the collimator. The collimator 3 having a particle getter function is shown herein as a lattice assembly of crossing embossed particle getter sheets (PG sheets) fitted to a frame 16. The lattice assembly of particle getter sheets is fabricated, for example, in the manner illustrated in FIGS. 4A–C. A number of PG sheets are prepared and worked, e.g., by laser cutting, as depicted at FIG. 4A, into two types of sheets, 15A and 15B. Each sheet 15A is formed with a plurality of slots having a width slightly greater than the thickness of the PG sheets (usually 2 to 3 mm thick) at suitable intervals of 15 to 30 mm which constitute one side of each collimator cell. Each sheet 15B is formed with a plurality of slits along both edges, having a width slightly greater than the thickness of the PG sheets, at intervals corresponding to the slots of the sheet 15A. Next, as indicated at FIG. 4B, the slotted and slitted PG sheets 15A and 15B are folded over from the center so that their particle getting sides are the outer sides. Then, as at FIG. 4C, the PG sheets 15A and 15B, as folded double, are passed through an embossing (or rolling) machine, whereby embossed PG sheets 15A and 15B are obtained, each embossed on one side with the folded halves adhered closely from the folded edge to the opposite edge. The embossed PG sheets thus obtained are then assembled in a lattice pattern, as shown in FIG. 3, with their slits engaged at right angles to each other. Finally, the lattice assembly so formed is fixed by spot welding or the like to a stainless steel frame 16, with their folded edges aligned to the direction from which sputtered atoms come forward.

Fabrication of the particle getter sheet assembly is not limited to the method described above. For example, slotted PG sheets, not folded double as above, may be directly crossed into a latticework. PG sheets bent to form triangular, square, or pentagonal openings may be assembled by spot welding. Circular or square tubes formed of PG sheets may be bundled together and cut to a desired length.

As a further alternative, an assembly of lattice or honeycomb structure is built first from copper, stainless steel, or nickel sheets, and an electrodeposit is formed by electrolysis on the lattice or honeycomb surface.

The collimator thus constructed is set between a film forming source and a substrate inside the thin-film forming apparatus. Associated parts such as the upper and lower shields are provided with particle getter foil as usual.

EXAMPLES

A lattice collimator having a particle getter function as shown in FIGS. 3 and 4 was fabricated. As particle getter (PG) sheets, PG sheets of electrolytic copper foil with an electrodeposit of copper was used. A number of PG sheets in the form of 40 mm-wide strips were made in advance. They were worked by laser cutting into two types of PG sheets. One was formed with a row of slots 20 mm by 2.5 mm along the axially central portion at intervals of 20 mm. The other was formed with slits 2.5 mm wide along the both edges at intervals of 20 mm correspondingly to the slots of the slotted sheet. The two types of the worked PG sheets were folded double so that their PG treated sides were outer sides. They were then passed through an embossing (or rolling) machine, whereby embossed PG sheets 15A and 15B were obtained, each embossed with a raised pattern on one side and with a dented pattern on the reverse side, with the folded halves adhered closely from the folded edge to the opposite edge. The embossed PG sheets thus obtained with slits were then assembled into a lattice. Finally, the assembly so formed was fixed by spot welding to a ring frame of stainless steel (SUS77) with their folded edges aligned to the direction from which atoms come forward upon sputtering.

This collimator was incorporated in an apparatus for forming thin films by sputtering on an industrial scale (type "E5500" manufactured by Applied Materials Inc.) and its performance was evaluated. The quantity of particles that result from peeling decreased to one-half to one-third of the levels with conventional collimators.

ADVANTAGES OF THE INVENTION

The peeling of deposited films formed on the collimator in a thin-film forming apparatus can be prevented without reducing the performance of the collimator. This further reduces the number of particle generated on a film formed on a substrate, rendering it possible to achieve greater improvements in the product yield and reliability.

We claim:

1. A collimator for a thin film forming apparatus comprising a plurality of collimator cells for directional film forming, the collimator being constructed solely of slitted particle getter metal sheets assembled in a lattice pattern by engaging their slits with each other to form the collimator cells, each of the particle getter metal sheets being an electrolytic copper sheet with a knobbed rough surface matte side further electrolytically treated to have fine particles of copper or copper oxide deposited on the knobbed rough surface, the surface of the matte side adapted to capture and hold particulate film matter deposited and formed thereon, and thereby inhibit the captured and held particulate film matter from peeling off, without impairing the function of the collimator, each of the electrolytic copper sheets having a thickness sufficient to define a self-supporting structure, wherein the thickness is 2 to 3 millimeters.

2. A collimator according to claim 1 wherein the collimator cells are constructed of embossed slitted particle getter metal sheets.

3. A thin film forming apparatus comprising a collimator positioned between a film forming source and a substrate, the collimator comprising a plurality of collimator cells for directional film forming, the collimator being constructed solely of slitted particle getter metal sheets assembled in a lattice pattern by engaging their slits with each other to form the collimator cells, each of the particle getter metal sheets being an electrolytic copper sheet with a knobbed rough surface matte side further electrolytically treated to have fine particles of copper or copper oxide deposited on the knobbed rough surface, the surface of the matte side adapted to capture and hold particulate film matter deposited and formed thereon, and thereby inhibit the captured and held particulate film matter from peeling off, without impairing the function of the collimator, each of the electrolytic copper sheets having a thickness sufficient to define a self-supporting structure, wherein the thickness is 2 to 3 millimeters.

4. A thin film forming apparatus according to claim 3 wherein the collimator cells are constructed of embossed slitted particle getter metal sheets.

* * * * *